United States Patent [19]
Nagasaka et al.

[11] Patent Number: 5,814,431
[45] Date of Patent: Sep. 29, 1998

[54] PHOTOSENSITIVE COMPOSITION AND LITHOGRAPHIC PRINTING PLATE

[75] Inventors: Hideki Nagasaka; Akihisa Murata; Toshiyuki Urano; Ryuichiro Takasaki, all of Yokohama, Japan

[73] Assignee: Mitsubishi Chemical Corporation, Tokyo, Japan

[21] Appl. No.: 778,783

[22] Filed: Jan. 6, 1997

[30] Foreign Application Priority Data

| Jan. 10, 1996 | [JP] | Japan | 8-002176 |
| Mar. 12, 1996 | [JP] | Japan | 8-054849 |
| Jul. 23, 1996 | [JP] | Japan | 8-193587 |

[51] Int. Cl.$^6$ .................................. G03C 1/725
[52] U.S. Cl. ........................... 430/281.1; 430/270.1; 430/325; 430/909; 430/926; 430/920
[58] Field of Search .............................. 430/270.1, 325, 430/283.1, 281.1, 909, 920, 926, 927

[56] References Cited

U.S. PATENT DOCUMENTS

| 4,702,997 | 10/1987 | Ai et al. ........................ 430/325 |
| 4,708,925 | 11/1987 | Newman ........................ 430/270 |
| 5,057,398 | 10/1991 | Frommeld et al. ............... 430/277 |
| 5,340,697 | 8/1994 | Yoshimoto et al. .............. 430/270 |
| 5,401,608 | 3/1995 | Pawlowski et al. .............. 430/270 |
| 5,466,557 | 11/1995 | Haley et al. ................... 430/278 |
| 5,491,046 | 2/1996 | Deboer et al. .................. 430/302 |

FOREIGN PATENT DOCUMENTS

| 146411 | 6/1985 | European Pat. Off. . |
| 488231 | 6/1992 | European Pat. Off. . |
| 0 568 993 | 11/1993 | European Pat. Off. . |
| 0 672 954 A2 | 9/1995 | European Pat. Off. . |

*Primary Examiner*—Janet C. Baxter
*Assistant Examiner*—Rosemary Ashton
*Attorney, Agent, or Firm*—Oblon, Spivak, Mcclelland, Maier & Neustadt, P.C.

[57] ABSTRACT

A photosensitive composition comprising
   (a) a resin selected from the group consisting of novolak resins and polyvinylphenol resins;
   (b) an amino compound derivative capable of curing the resin;
   (c) at least one member selected from the group consisting of cyanine compounds of the following formula (I) and polymethine compounds of the following formula (II), as a compound showing absorption in a near infrared wavelength region:

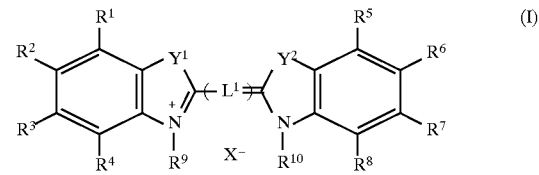

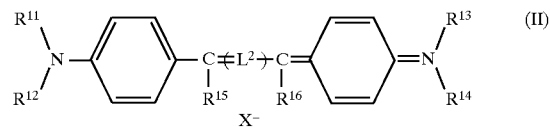

(d) a photosensitive acid-forming agent.

22 Claims, No Drawings

PHOTOSENSITIVE COMPOSITION AND LITHOGRAPHIC PRINTING PLATE

The present invention relates to a negative chemical amplification type photosensitive composition which is highly sensitive particularly to light in a near infrared wavelength region, and a lithographic printing plate having such a photosensitive composition coated thereon. Particularly, it relates to a lithographic printing plate particularly suitable for direct plate making by a semiconductor laser.

Along with the progress in the image treating technology by computers, an attention has been drawn to a photosensitive or heat sensitive direct plate making system wherein a resist image is formed directly from digital image information by a laser beam or a thermal head without using a silver salt masking film. Especially a high resolution laser photosensitive direct plate making system employing a high power semiconductor laser, has merits such that it is small in size and the semiconductor laser has a long useful life, and it has been strongly desired to develop such a system.

On the other hand, as image-forming methods wherein laser photosensitivity or heat sensitivity is utilized, there have heretofore been known a method of forming a color image by means of a sublimable transfer dye and a method of preparing a lithographic printing plate. Known as the latter is, for example, a method of preparing a lithographic printing plate by means of the curing reaction of a diazo compound (e.g. JP-A-52-151024, JP-B-2-51732, JP-A-50-15603, JP-B-3-34051, JP-B-61-21831, JP-B-60-12939 and U.S. Pat. No. 3,664,737), or a method of preparing a lithographic printing plate by means of the decomposition reaction of nitrocellulose (e.g. JP-A-50-102403 and JP-A-50-102401).

In recent years, a technique in which a chemical amplification type photoresist is combined with a long wavelength light ray absorbing dye, has been proposed. For example, JP-A-6-43633 discloses a photosensitive material wherein a certain specific squarilium dye is combined with a photosensitive acid-forming agent and a binder.

Further, as a technique of this type, a technique for preparing a lithographic printing plate by exposing a photosensitive layer containing an infrared ray absorbing dye latent Bronsted acid, a resol resin and a novolak resin, in an image pattern by e.g. a semiconductor laser has been proposed (JP-A-7-20629). Further, the same technique wherein a s-triazine compound is used instead of the above latent Bronsted acid, has also been proposed (JP-A-7-271029).

However, these conventional techniques were not practically useful, since the sensitivity was inadequate, or the inking property or storage stability was not necessarily adequate.

The present invention has been made in view of the various problems as described above, and it is an object of the present invention to provide a photosensitive composition for presenting a lithographic printing plate which is suitable for direct plate making by a near infrared semiconductor laser and which is highly sensitive and excellent in the inking property and having improved storage stability, and to provide such a lithographic printing plate having the photosensitive composition coated on a support.

Such an object of the present invention can be accomplished by a photosensitive composition comprising
(a) a resin selected from the group consisting of novolak resins and polyvinylphenol resins;
(b) an amino compound derivative capable of curing the resin;
(c) at least one member selected from the group consisting of cyanine compounds of the following formula, (I) and polymethine compounds of the following formula (II), as a compound showing absorption in a near infrared wavelength region:

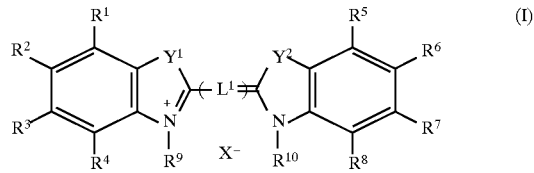

wherein each of $R^1$ to $R^8$ which are independent of one another, is a hydrogen atom, a halogen atom or a nitro group, or the adjacent groups among $R^1$ to $R^8$ may be connected to each other to form a condensed benzene ring, each of $R^9$ and $R^{10}$ which are independent of each other, is an alkyl group which may have a substituent, a phenyl group which may have a substituent, an alkenyl group which may have a substituent, or an alkynyl group which may have a substituent, each of $Y^1$ and $Y^2$ which are independent of each other, is a sulfur atom or a dialkylmethylene group, $L^1$ is a penta- or hepta-methine group which may have a substituent, wherein two substituents on the penta- or heptamethine group may be connected to each other to form a $C_{5-7}$ cycloalkene ring, and $X^-$ is a counter anion;

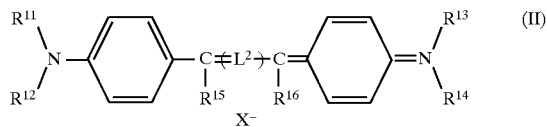

wherein each of $R^{11}$ to $R^{14}$ which are independent of one another, is an alkyl group, each of $R^{15}$ and $R^{16}$ which are independent of each other, is an aryl group which may have a substituent, $L^2$ is a mono-, tri- or penta-methine group which may have a substituent, and $X^-$ is a counter anion; and
(d) a photosensitive acid-forming agent; and a photosensitive lithographic printing plate having such a photosensitive composition coated on a support.

Now, the present invention will be described in detail with reference to the preferred embodiments.

As the resin component (a) of the photosensitive composition for a lithographic printing plate of the present invention, a novolak resin or a polyvinyl phenol resin is used.

The novolak resin may, for example, be the one obtained by poly-condensing at least one member selected from aromatic hydrocarbons such as m-cresol, o-cresol, p-cresol, 2,5-xylenol, 3,5-xylenol, resorcinol, pyrogallol, bisphenol, bisphenol A, trisphenol, o-ethylphenol, m-ethylphenol, p-ethylphenol, propylphenol, n-butylphenol, t-butylphenol, 1-naphthol and 2-naphthol, with at least one aldehyde or ketone selected from the group consisting of aldehydes such as formaldehyde, acetaldehyde, propionaldehyde, benzaldehyde and furfural, and ketones such as acetone, methyl ethyl ketone and methyl isobutyl ketone, in the presence of an acid catalyst.

Instead of the formaldehyde and acetaldehyde, paraformaldehyde and paraldehyde may respectively be used. It is preferred to use a novolak resin, of which the weight average molecular weight as calculated as polystyrene, obtained by the measurement by gel permeation chromatography (hereinafter referred to simply as GPC) (the weight average molecular weight by the GPC measurement will hereinafter be referred to simply as Mw) is preferably from 1,000 to 15,000, more preferably from 1,500 to 10,000.

Preferred is a novolak resin obtained by poly-condensing at least one phenol, as an aromatic hydrocarbon, selected from the group consisting of o-cresol, m-cresol, p-cresol, 2,5-xylenol, 3,5-xylenol and resorcinol, with at least one member selected from the group consisting of aldehydes such as formaldehyde, acetaldehyde, and propionaldehyde.

Particularly preferred is a novolak resin which is a condensation product of a phenol mixture of m-cresol:p-cresol:2,5-xylenol:3,5-xylenol:resorcinol in a molar ratio of 70 to 100:0 to 30:0 to 20:0 to 20, or a phenol mixture of phenol:m-cresol:p-cresol in a molar ratio of 10 to 100:0 to 60:0 to 40, with an aldehyde or aldehydes. Among aldehydes, formaldehyde is particularly preferred.

The polyvinyl phenol resin may, for example, be a polymer of one or more hydroxystyrenes such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene. The hydroxystyrenes may have a substituents, for example, a halogen such as chlorine, bromine, iodine or fluorine, or a $C_{1-4}$ alkyl group, on their aromatic rings. Accordingly, the polyvinyl phenols may, for example, be polyvinyl phenols which may have a halogen or a $C_{1-4}$ alkyl group as a substituent on their aromatic rings.

The polyvinyl phenol resin can usually be prepared by polymerizing one or more hydroxystyrenes which may have substituents, in the presence of a radical polymerization initiator or a cation polymerization initiator. Such a polyvinyl phenol resin may be the one which has been subjected to partial hydrogenation.

Further, it may be a resin having a part of OH groups of a polyvinyl phenol protected by t-butoxycarbonyl groups, pyranyl groups or furanyl groups. Mw of the polyvinyl phenol resin is preferably from 1,000 to 100,000, more preferably from 1,500 to 50,000.

As the polyvinyl phenol resin, more preferred is a polyvinyl phenol which may have a $C_{1-4}$ alkyl group as a substituent on the aromatic ring. Particularly preferred is an unsubstituted polyvinyl phenol.

If the molecular weight of the above novolak resin or polyvinyl phenol resin is smaller than the above range, it tends to be difficult to obtain an adequate coating film as a resist, and if it exceeds the above range, the solubility of the non-exposed portion in an alkali developer tends to be small, whereby it tends to be difficult to obtain a resist pattern.

Among the above described resins, a novolak resin is particularly preferred. The proportion of such a resin in the total solid content of the photosensitive composition is usually from 40 to 95%, preferably from 60 to 90%.

Now, the amino compound derivative (b) capable of curing the resin (a), to be used in the present invention, will be described. Such an amino compound derivative acts as a curing agent which cures and insolubilizes the resin by the action of an acid formed at the exposed portion. It may, for example, be an amino compound having at least two functional groups such as methylol groups, alkoxymethyl groups as alcohol condensation-modified groups thereof, or acetoxymethyl groups. Specifically, it may, for example, be a melamine derivative such as ethoxymethylated melamine (Cymel 300 series (1), manufactured by Mitsui Cyanamid K.K.), a benzoguanamine derivative (methyl/ethyl mixed alkoxylated benzoguanamine resin, Cymel 1,100 series (2), manufactured by Mitsui Cyanamid K.K.), a glycoluril derivative (tetramethylolglycoluril resin, Cymel 1,100 series (3), manufactured by Mitsui Cyanamid K.K.) or other urea resin derivatives.

Among them, a melamine derivative is preferred. Further, when the inking property or the storage stability of the resulting lithographic printing plate is taken into consideration, the one having functional groups within a certain specific range, is more preferred. Namely, more preferred is a melamine derivative wherein the proportion of the number of alkoxymethyl groups in the total number of methylol groups and alkoxymethyl groups in the curing agent as the melamine derivative, is at least 70%. Particularly preferred is a melamine derivative wherein the above proportion is at least 90%. Such a melamine derivative can be prepared in accordance with a known method wherein a melamine is reacted with a certain specific amount of formaldehyde and an alcohol in an acidic condition. The proportion of the alkoxymethyl groups in the obtained melamine derivative, can be determined by the measurement by $^{13}$C-NMR.

The proportion of such an amino compound derivative in the total solid content of the photosensitive material in the present invention is preferably from 5 to 50 wt %, more preferably from 10 to 30 wt %.

Then, the cyanine or polymethine compound showing absorption in a near infrared wavelength region as the component (c) to be used in the present invention, will be described.

Among compounds showing absorption in a near infrared. wavelength region to be used in the present invention, the cyanine compounds are those represented by the following formula (I):

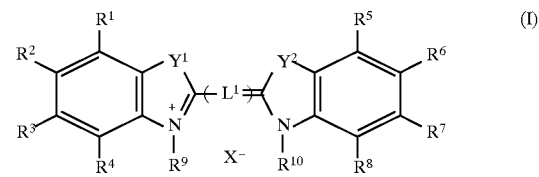

The compound of the formula (I) will be described in detail. Each of $R^1$ to $R^8$ which are independent of one another, is a hydrogen atom, a halogen atom or a nitro group, or the adjacent groups among $R^1$ to $R^8$ may be connected to each other to form a condensed benzene ring. In such a definition, the halogen atom is preferably a chorine atom, and among $R^1$ to $R^8$, from 4 to 8 are preferably hydrogen atoms.

Each of $R^9$ and $R^{10}$ which are independent of each other, is an alkyl group which may have a substituent, a phenyl group which may have a substituent, an alkenyl group or an alkynyl group. Among them, preferred is an alkyl group unsubstituted or substituted by an alkoxy group, an aryloxy group, an acyl group, a phenyl group, a hydroxyl group, a halogen atom, a carboxyl group or a sulfonic acid group; a phenyl group unsubstituted or substituted by an alkyl group, an alkenyl group, an alkynyl group, an alkoxy group, an aryloxy group, an acyl group, a hydroxyl group or a halogen atom; an alkenyl group; or an alkynyl group. Particularly preferred is an alkyl group, a hydroxyalkyl group, an alkoxyalkyl group, a phenoxyalkyl group, an allyl group or a phenyl group.

Each of $Y^1$ and $Y^2$ which are independent of each other, is a sulfur atom or a dialkylmethylene group, preferably a sulfur atom or a dimethylmethylene group, more preferably a dimethylmethylene group.

$L^1$ is a penta- or hepta-methine group which may have a substituent, wherein two substituents on the penta- or hepta-methine group may be connected to each other to form a $C_{5-7}$ cycloalkene ring. As the substituent, an alkyl group, a halogen atom or a diarylamino group is preferred. Further, when two substituents are connected, it is preferred that they form a cyclopentene ring.

$X^-$ is a counter anion, which may, for example, be an inorganic acid ion such as $Cl^-$, $I^-$, $Br^-$, $ClO_4^-$, $BF_4^-$ or $PF_6^-$, or an ion of an organic acid such as benzene sulfonic acid, p-toluene sulfonic acid, naphthalene-1-sulfonic acid or acetic acid. Among them, preferred is $I^-$, $ClO_4^-$, $BF_4^-$, $PF_6^-$ or p-toluene sulfonic acid ion.

Among the compounds showing absorption in a near infrared wavelength region to be used in the present invention, the polymethine compounds are those of the following formula (II):

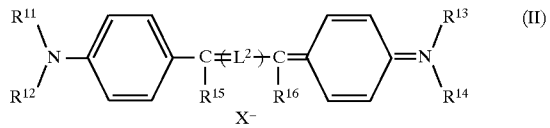

The compounds of the formula (II) will be described in detail. Each of $R^{11}$ to $R^{14}$ which are independent of one another, is an alkyl group, which may, for example, be a methyl group, an ethyl group, a propyl group, a butyl group, a pentyl group, a hexyl group, a heptyl group, an octyl group, an isopropyl group, an isobutyl group, a sec-butyl group, a t-butyl group, a cyclopentyl group or a cyclohexyl group, usually a $C_{1-12}$ alkyl group.

Each of $R^{15}$ and $R^{16}$ which are independent of each other, is an aryl group which may have a substituent. It may, for example, be an unsubstituted aryl group such as a phenyl group, a 1-naphthyl group, a 2-naphthyl group, a 2-furyl group, a 3-furyl group, a 2-thienyl group or a 3-thienyl group, an aryl group substituted by an alkyl group, such as a tolyl group, a xylyl group or a furfuryl group, an aryl group substituted by a halogen atom, such as a 2-chlorophenyl group, a 4-chlorophenyl group or a 4-bromophenyl group, an aryl group substituted by a hydroxyl group, such as a 4-hydroxyphenyl group or a 5-hydroxy-2-furyl group, an aryl group substituted by an alkoxy group, such as a 4-methoxyphenyl group or a 4-ethoxyphenyl group, or an aryl group substituted by a dialkylamino group, such as a 4-dimethylaminophenyl group or a 4-diethylaminophenyl group. Among them, a phenyl group unsubstituted or substituted by an alkoxy group or a dimethylamino group, is preferred. Particularly preferred is a phenyl group substituted by a dimethylamino group.

$L^2$ is a mono-, tri- or penta-methine group which may have a substituent, wherein the substituent is preferably an alkyl group, an alkenyl group which may be substituted by a phenyl group, or a halogen atom.

$X^-$ is a counter anion, which may, for example, be an inorganic acid ion such as $Cl^-$, $I^-$, $Br^-$, $ClO_4^-$, $BF_4^-$ or $PF_6^-$, or an ion of an organic acid such as benzene sulfonic acid, p-toluene sulfonic acid, naphthalene-1-sulfonic acid or acetic acid. Among them, $I^-$, $ClO_4^-$, $BF_4^-$, $PF_6^-$ or a toluene sulfonic acid ion is preferred. Specific examples of such cyanine compounds and polymethine compounds will be shown in Table 1. The wavelengths in brackets indicate the maximum absorption wavelengths of the dyes.

TABLE 1

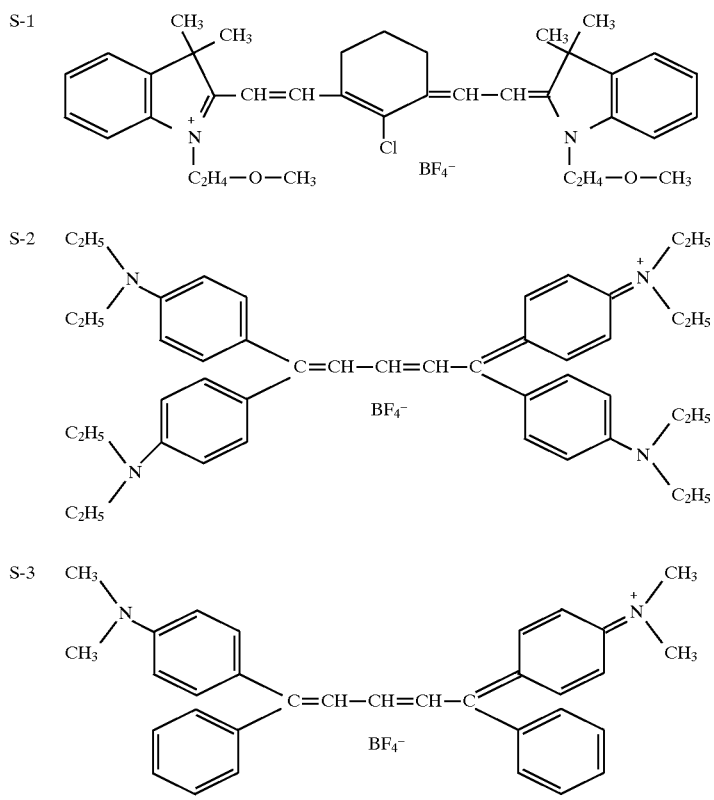

TABLE 1-continued
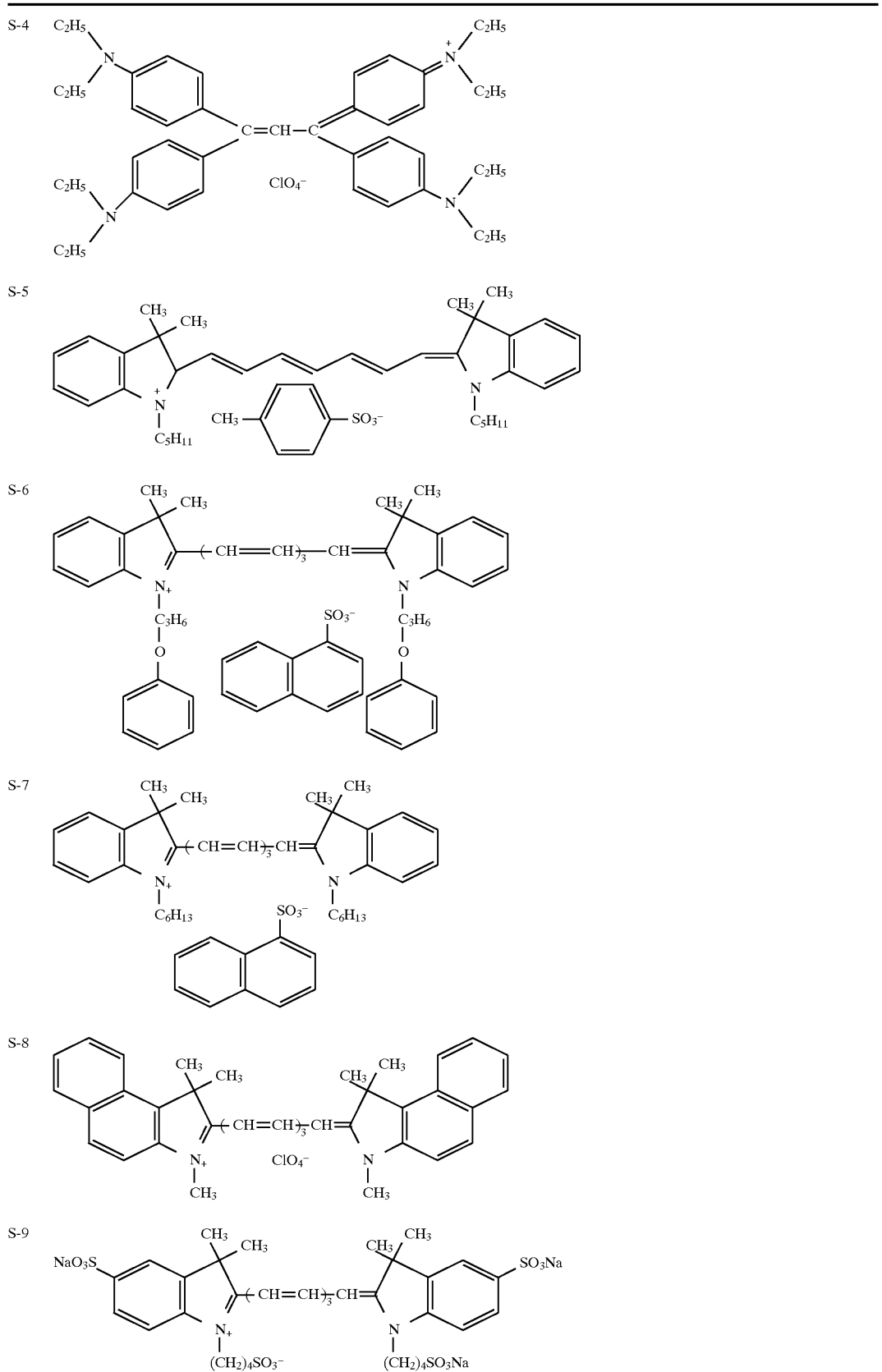

TABLE 1-continued
S-10 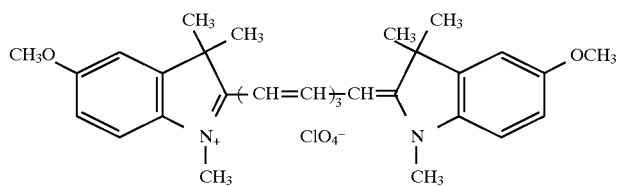
S-11 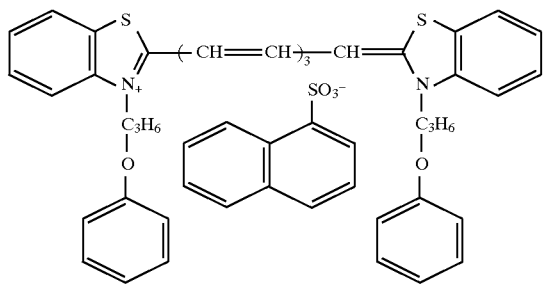
S-12 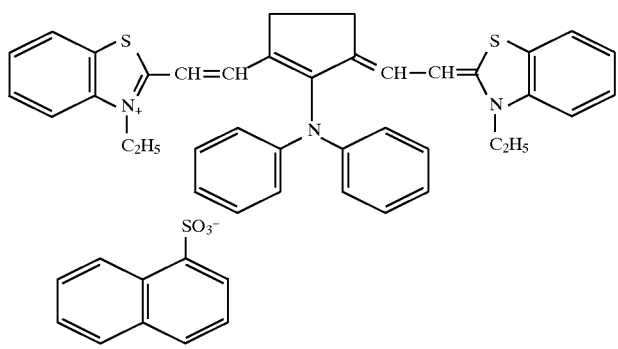
S-13 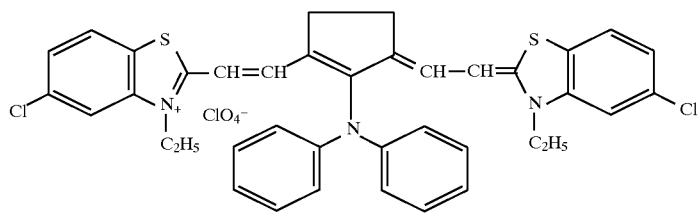
S-14 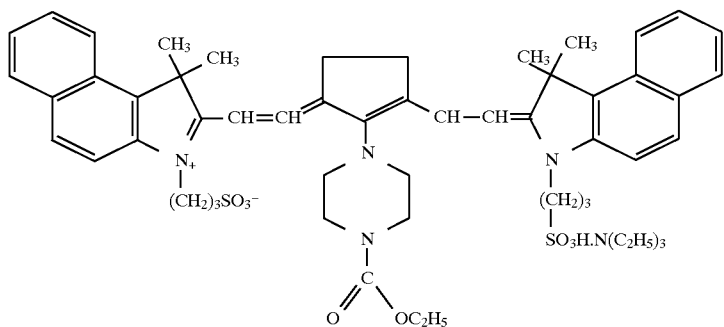
S-15 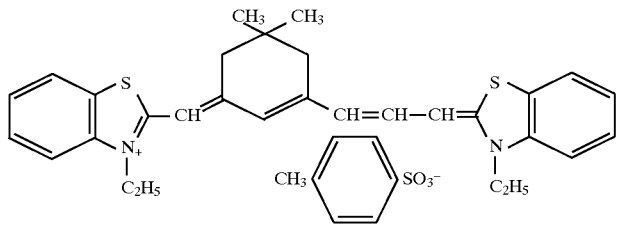

TABLE 1-continued
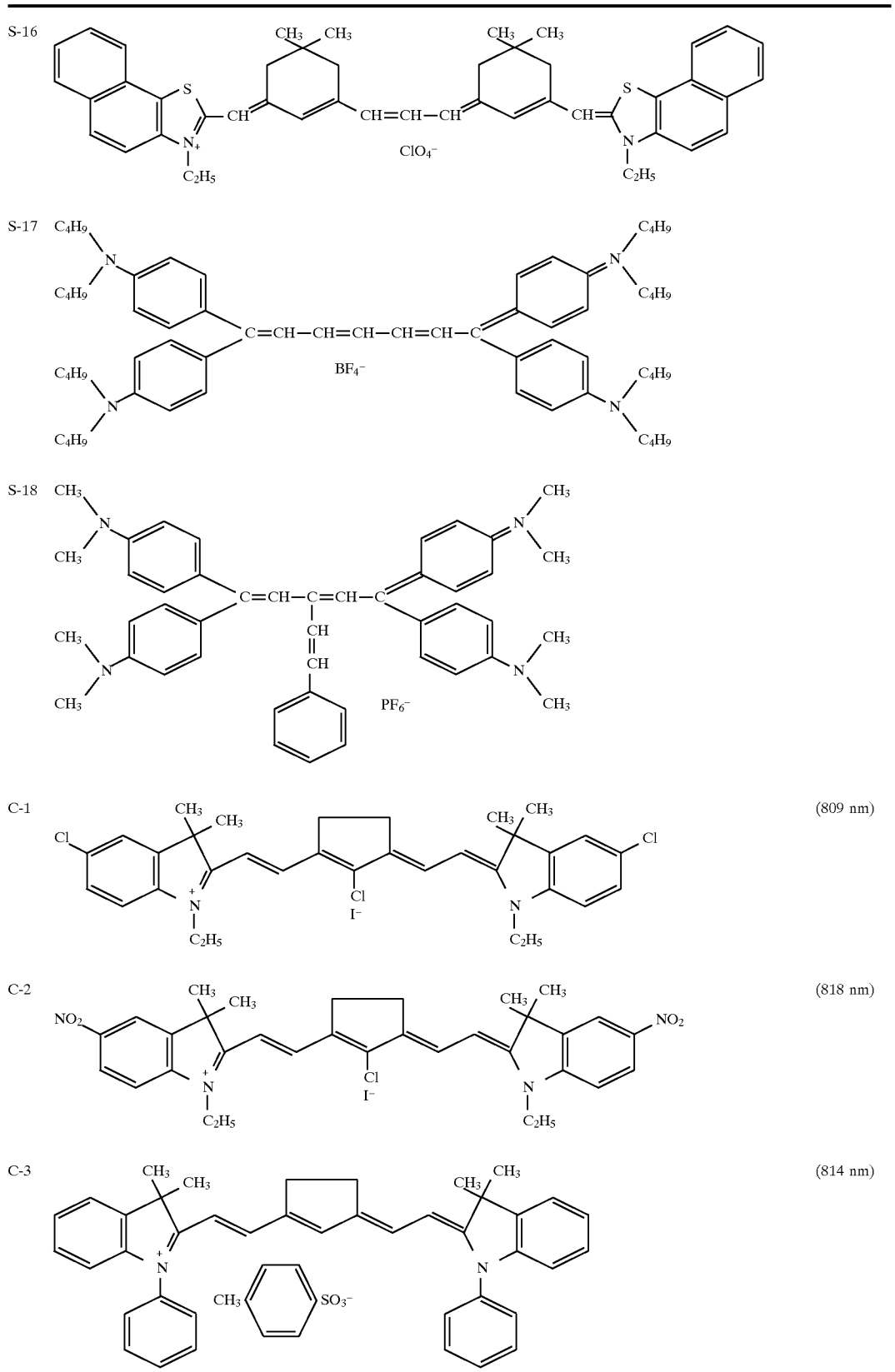

TABLE 1-continued
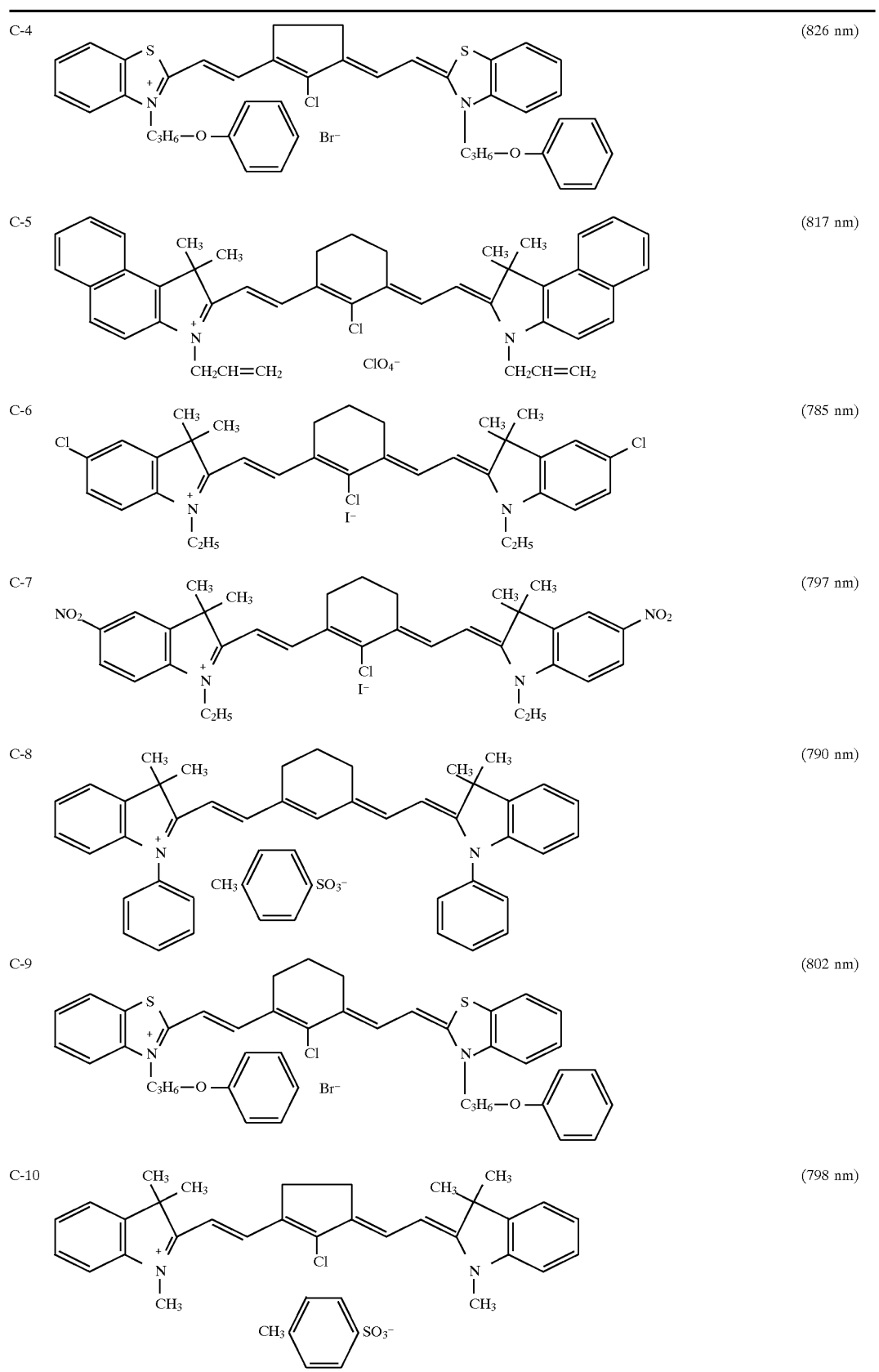

TABLE 1-continued
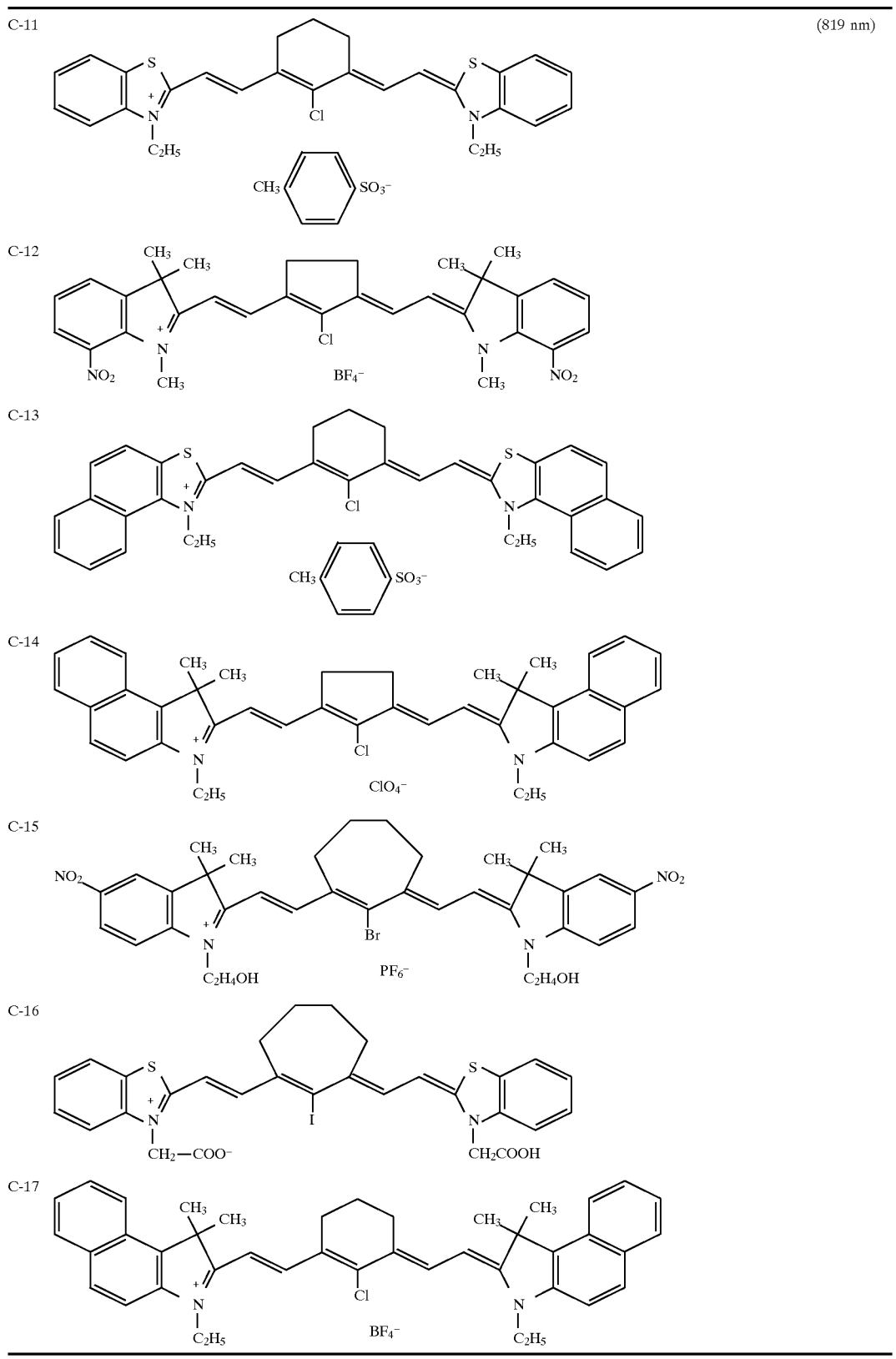
(819 nm)

Among these, a cyanine dye is more preferred. Particularly preferred is an indole type cyanine (indocyanine) or thiazole type cyanine (thiocyanine) dye.

The content of such a dye which absorbs near infrared light is usually from 0.1 to 50 wt %, preferably from 0.5 to 30 wt %, more preferably from 1 to 15 wt %, based on the total solid content of the photosensitive composition. If the content is lower than 0.1 wt %, the sensitivity tends to deteriorate remarkably, and if it exceeds 50 wt %, an adverse effect to the performance such as stability is likely to result.

The photosensitive acid-forming agent which forms an, acid under irradiation, to be used in the present invention, may, for example, be:

1) a diazonium salt disclosed, for example, in S. I. Schlesinger, Photogr. Sci. Eng., 18, 387 (1974), T. S. Bal et al, Polymer 21, 423 (1980);

2) an ammonium salt disclosed, for example, in U.S. Pat. Nos. 4,069,055, 4,069,056 and Re 27,992 and JP-A-3-140140.

3) a phosphonium salt disclosed, for example, in D. C. Necker et al, Macromolecules, 17, 2468 (1984), C. S. Wen et al, Teh, Proc. Conf. Rad. Curing ASIA, p 478, Tokyo, October (1988), and U.S. Pat. Nos. 4,069,055 and 4,069,056;

4) an iodonium salt disclosed, for example, in J. V. Crivello et al, Macromolecules, 10 (6), 1307 (1977), Chem. & Eng. News, November 28, p 31 (1988), EP-104,143, U.S. Pat. Nos. 339,049 and 410,201, JP-A-2-150848 and JP-A-2-296514;

5) a sulfonium salt disclosed, for example, in J. V. Crivello et al, Polymer J. 17, 73 (1985), J. V. Crivello et al, J. Org. Chem., 43, 3055 (1978), W. R. Watt et al, J. Polymer Sci., Polymer Chem. Ed., 22, 1789 (1984), J. V. Crivello et al, Polymer Bul., 14, 279 (1988), J. V. Crivello et al, Macromolecules, 14 (5), 1141 (1981), J. V. Crivello et at, J. Polymer Sci. Polymer Chem. Ed., 17, 2877 (1979), EP-370,693, EP-3,902,114, EP-233,567, EP-297,443, EP-297,442, U.S. Pat. Nos. 4,933,377, 161,811, 410,201, 339,049, 4,760,013, 4,734,444 and 2,833,827, and German Patents 2,904,626, 3,6,4,580 and 3,6,4,581;

6) a selenonium salt disclosed, for example, in J. V. Crivello et al, Macromolecules, 10 (6), 1307 (1977), J. V. Crivello et al, J. Polymer Sci., Polymer Chem. Ed., 17, 1047 (1979);

7) an onium salt such as an arsonium salt disclosed, for example, in C. S. Wen et al, Teh. Proc. Conf. Rad. Curing ASIA, P 478, Tokyo, October (1988);

8) an organic halogen compound disclosed, for example, in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339;

9) an organic metal/organic halogen compound disclosed, for example, in K. Meier et al, J. Rad. Curing, 13 (4), 26 (1986), T. P. Gill et al, Inorg. Chem., 19, 3007 (1980), D. Astruc. Acc. Chem. Res., 19 (12), 377 (1986), and JP-A-2-161445;

10) a photosensitive acid-forming agent having an o-nitrobenzyl type protecting group disclosed, for example, in J. Hayase et al, J. Polymer Sci., 25, 753 (1987), E. Reichmanis et al, J. Polymer Sci., Polymer Chem. Ed. 23, 1 (1985), Q. Q. Zhu et al, J. Photochem. 36, 85, 39, 317 91987), B. Amit et al, Tetradedron Lett., (24) 2205 (1973), D. H. R. Barton et al, J. Chem. Soc., 3571 (1965), P. M. Collins et al, J. Chem. Soc., Perkin I, 1695 (1975), M. Rudinstein et al, Tetrahedron Lett., (17), 1445 (1975), J. W. Walker et al, J. Am. Chem. Soc., 110, 7170 (1988), S. C. Busman et al, J. Imaging Technol., 11 (4), 191 (1985), H. M. Houlihan et al, Macromolecules, 21, 2001 (1988), P. M. Collins et al, J. Chem. Soc., Chem. Commun., 532 (1972), S. Hayase et al, Macromolecules, 18, 1799 (1985), E. Reichmanis et al, J. Electrochem. Soc., Solid State Sci. Technol., 130 (6), F. M. Houlihan et al, Macromolecules, 21, 2001 (1988), EP-0290,750, EP-046,083, EP-156,535, EP-271,851, EP-0,388,343, U.S. Pat. Nos. 3,901,710 and 4,181,531, JP-A-60-198538 and JP-A-53-133022; or 11) a compound which forms sulfonic acid upon photodecomposition, represented by an iminosulfonate, disclosed, for example, in M. Tunooka et al, Polymer Preprints Japan, 38 (8), G. Berner e al, J. Rad. Curing, 13 (4), W. J. Mijis et al, Coating Technol., 55 (697), 45 (1983), Akzo, H. Adachi et al, Polymer Preprints, Japan, 37 (3), EP-0199,672, EP-84515, EP-199,672, EP-044,115, EP-0101,122, U.S. Pat. Nos. 4,618,564, 4,371,605 and 4,431,774, JP-A-64-18143, JP-A-2-245756 and JP-3-140109, and a disulfone compound disclosed in JP-A-61-166544.

Further, a compound having such a group or compound capable of forming an acid by light introduced into the main chain or side chain, such as a compound disclosed, for example, in M. E. Woodhouse et al, J. Am. Chem. Soc., 104,5586 (1982), S. P. Pappas et al, J. Imaging Sci., 30 (5), 218 (1986), S. Kudo et al, Macromol. Chem. Rapid Commun., 9, 625 (1988), Y. Yamada et al, Macromol. Chem., 152, 153, 163 (1972), J. V. Crivello et al. J. Polymer Sci., Polymer Chem. Ed., 17, 1345 (1979), U.S. Pat. No. 3,849,137, German Patent 3,914,407, JP-A-63-26653, JP-A-55-164824, JP-A-62-69263, JP-A-63-140387, JP-A-63-163452, JP-A-62-153853 and JP-A-63-146029, may be employed.

Furthermore, a compound capable of forming an acid by light, disclosed, for example, in J. N. R. Pillai, Synthesis, (1), 1 (1980), A. Abad et al, Tetradedron Lett., (47) 4555 (1971), D. H. R. Barton et al, J. Chem. Soc., (C), 329 (1970), U.S. Pat. No. 3,779,778, and EP-126,712, may also be used.

Further, specifically, compounds of the following formulas T-1 to T-15 may, for example, be mentioned.

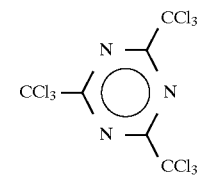

T-1

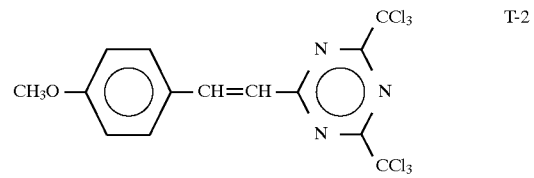

T-2

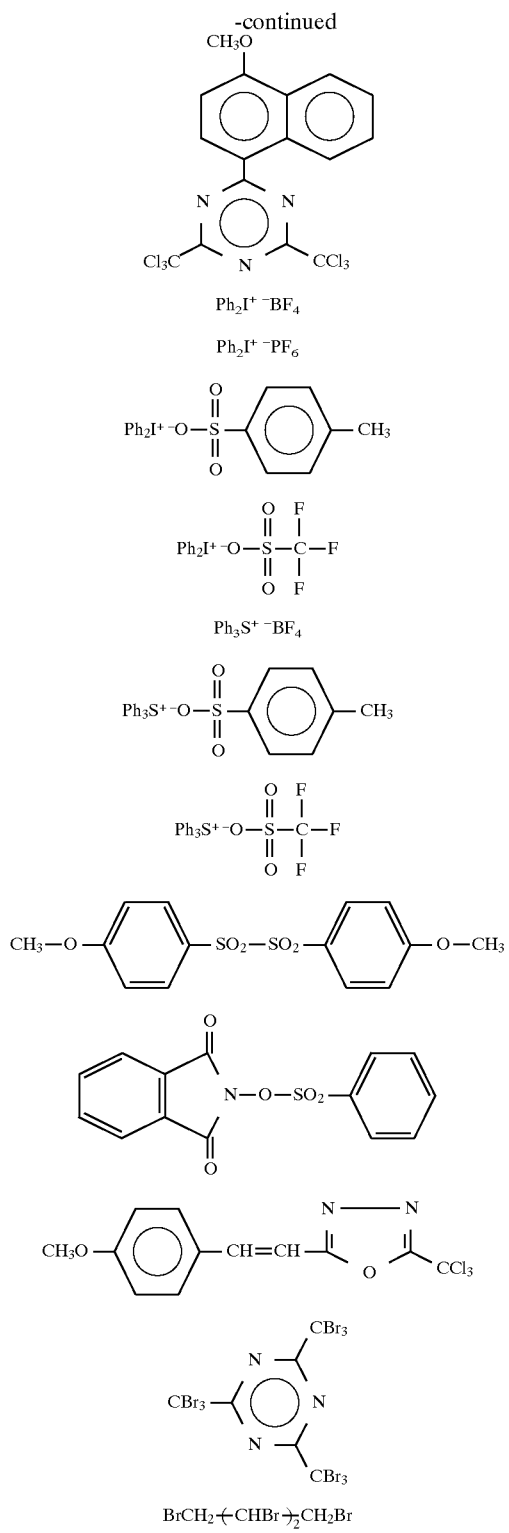

Among these, preferred is a s-triazine compound having at least two trihalomethyl groups, and particularly preferred is tris(trichloromethyl)-s-triazine.

The content of such a photosensitive acid-forming agent is usually from 0.1 to 40 wt %, preferably from 0.5 to 20 wt %, based on the total solid content of the photosensitive composition.

The photosensitive composition of the present invention is prepared usually by dissolving the above described various components in a suitable solvent. The solvent is not particularly limited so long as it is a solvent which presents an excellent coating film property and provides sufficient solubility for the components used. It may, for example, be a cellosolve solvent such as methylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl butyrate, butyl butylate, diethyl oxalate, ethyl pyruvate, methyl-2-hydroxy butyrate, ethyl acetate, methyl lactate, ethyl lactate or methyl 3-methoxypropionate, an alcohol solvent such as heptanol, hexanol, diacetone alcohol or furfuryl alcohol, a ketone solvent such as cyclohexanone or methyl amyl ketone, a highly polar solvent such as dimethyl formamide, dimethyl acetamide or n-methyl pyrrolidone, or a solvent mixture thereof, or the one having an aromatic hydrocarbon added thereto. The proportion of the solvent is usually within a range of from 1 to 20 times in a weight ratio to the total amount of the photosensitive material.

The photosensitive composition of the present invention may contain various additives, such as a dye, a pigment, a coating property-improving agent, a development-improving agent, an adhesion-improving agent, a sensitivity-improving agent, a lipid sensitive agent, etc. within a range not to impair the performance of the composition.

As a method for coating the photosensitive composition on the surface of a support, to be used in the present invention, a conventional method such as rotational coating, wire bar coating, dip coating, air knife coating, roll coating, blade coating or curtain coating may, for example, be employed. The coated amount varies depending upon the particular use, but is usually preferably from 0.1 to 10.0 g/m² (as the solid content). The temperature for drying is, for example, from 20 to 150° C., preferably from 30° to 100° C.

The support on which a photosensitive layer made of the photosensitive composition of the present invention will be formed, may, for example, be a metal plate of e.g. aluminum, zinc, steel or copper, a metal plate having chromium, zinc, copper, nickel, aluminum, iron or the like plated or vapor-deposited thereon, a paper sheet, a plastic film, a glass sheet, a resin-coated paper sheet, a paper sheet having a metal foil such as an aluminum foil bonded thereto, or a plastic film having hydrophilic treatment applied thereto. Among them, preferred is an aluminum plate. As the support for a photosensitive lithographic printing plate of the present invention, it is particularly preferred to employ an aluminum plate having grain treatment applied by brush polishing or electrolytic etching in a hydrochloric acid or nitric acid solution, having anodizing treatment applied in a sulfuric acid solvent and, if necessary, having surface treatment such as pore sealing treatment applied.

The light source for image exposure of the photosensitive lithographic printing plate of the present invention is a light source for generating a near infrared laser beam of from 650 to 1,100 nm. For example, a solid laser such as ruby laser or a YAG laser, or a semiconductor laser may be mentioned. Particularly preferred is a semiconductor laser which is small in size and has a long useful life. With such a laser light source, scanning exposure is usually carried out, and then post exposure baking (hereinafter referred to simply as PEB) is preferably carried out, followed by development with a developer to obtain a lithographic printing plate having a developed image.

The temperature for PEB is preferably within a range of from 50° to 150° C., more preferably from 90° to 130° C.

As the developer, an alkali developer is preferred.

As the alkali developer, an aqueous solution of an alkali metal salt such as sodium hydroxide, potassium hydroxide, sodium carbonate, potassium carbonate, sodium methasilicate, potassium methasilicate, sodium secondary phosphate or sodium tertiary phosphate, may, for example, be mentioned. The concentration of the alkali metal salt is preferably from 0.1 to 20 wt %. Further, an anionic surfactant, an amphoteric surfactant or an organic solvent such as an alcohol, may be added to the developer, as the case requires.

Now, the present invention will be described in further detail with reference to Examples. However, it should be understood that the present invention is by no means restricted to such specific Examples.

The "methoxy proportion" used in these Examples, means the proportion of the number of methoxymethyl groups in the total number of methylol groups and methoxymethyl groups in the curing agent.

Preparation of an aluminum plate

An aluminum plate (material: 1050, hardness: H16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate as a support for a lithographic printing plate.

EXAMPLE 1

A photosensitive liquid comprising the following components, was coated by a wire bar on an aluminum plate prepared by the above described method and dried at 85° C. for 2 minutes to obtain a photosensitive lithographic printing plate having a film thickness of 20 $mg/dm^2$.

| | |
|---|---|
| Resin: m-cresol/p-cresol/xylenol novolak resin | 0.5 g |
| Curing agent: Cymel 300 (methoxymethyl melamine type, manufactured by Mitsui Cyanamid K.K., methoxy proportion: at least 90%) | 0.1 g |
| Infrared absorbing dye: CY-10 (above-mentioned S-1, manufactured by Nippon Kayaku Co., Ltd.) | 0.015 g |
| Photosensitive acid-forming agent: 2,4,6-tris(trichloromethyl)-s-triazine (above-mentioned T-1) | 0.015 g |
| Coating solvent: cyclohexanone | 5.7 g |

The printing plate was mounted on a rotary drum, and, scanning exposure was carried out by a laser beam (40 mW) formed by focusing a semiconductor laser (830 nm, by Applied Techno K.K.) by a lens to a beam diameter of 25 $\mu$m, under a yellow lamp. Then, heating was carried out at 100° C. for 3 minutes and then development was carried out at 25° C. for 30 seconds with a solution having developer SDR-1 (for a positive printing plate, manufactured by Konica K.K.) diluted 6 times. From the number of revolutions of the drum which gave an image line with a width of 25 $\mu$m, the sensitivity was obtained in terms of the energy value. The results are shown in Table 2.

EXAMPLE 2

The operation was carried out in the same manner as in Example 1 except that the amount of the photosensitive acid-forming agent 2,4,6-tris(trichloromethyl)-s-triazine in Example 1 was changed to 0.03 g. The results are shown in Table 2.

EXAMPLE 3

The operation was carried out in the same manner as in Example 1 except that 2,4,6-tris(trichloromethyl)-s-triazine in Example 1 was changed to 2,4-bis(trichloromethyl)-6-p-methoxyphenylethenyl)-s-triazine (above-mentioned T-2). The results are shown in Table 2.

EXAMPLE 4

The operation was carried out in the same manner as in Example 1 except that Cymel 300 in Example 1 was changed to N-8101 (ethylenebismelamine type, manufactured by Sanwa Chemical K.K.). The results are shown in Table 2.

EXAMPLE 5

The operation was carried out in the same manner as in Example 1 except that Cymel 300 in Example 1 was changed to Cymel 266 (methoxy/butoxy mixed methylated melamine type, manufactured by Mitsui Cyanamid K.K.). The results are shown in Table 2.

EXAMPLE 6

The operation was carried out in the same manner as in Example 1 except that instead of CY-10 as an infrared absorbing dye in Example 1, a cyanine compound of the above-mentioned S-7 was used. The results are shown in Table 2.

EXAMPLE 7

The operation was carried out in the same manner as in Example 1 except that instead of CY-10 as an infrared absorbing dye in Example 1, a cyanine compound of the above-mentioned S-11 was used. The results are shown in Table 2.

EXAMPLE 8

The operation was carried out in the same manner as in Example 1 except that instead of CY-10 as an infrared absorbing dye in Example 1, a cyanine compound of the above-mentioned S-12 was used. The results are shown in Table 2.

EXAMPLE 9

The operation was carried out in the same manner as in Example 1 except that instead of tris(trichloromethyl)-s-triazine in Example 1, diphenyl iodonium tetrafluoroborate (above-mentioned T-4) was used. The results are shown in Table 2.

EXAMPLE 10

The operation was carried out in the same manner as in Example 1 except that instead of Cymel 300 in Example 1, methoxylated methylol melamine having a methoxy proportion of at least 95%, was used. The results are shown in Table 2.

Further, this printing plate was stored in a dark place at room temperature for three months. Then, the sensitivity was determined, whereby no change in the sensitivity was observed. Further, the inking property was examined with a printing ink against the line image obtained by the scanning exposure and development operation as described in Example 1, whereby an excellent inking property was observed.

EXAMPLE 11

The operation was carried out in the same manner as in Example 1 except that instead of Cymel 300 in Example 1, methoxylated methylol melamine having a methoxy proportion of 60%, was used. The results are shown in Table 2.

Further, this printing plate was stored in a dark place at room temperature for three months. Then, the sensitivity was determined, whereby a slight decrease in the sensitivity was observed. The inking property was good, but was slightly poor as compared with the inking property in Example 10.

EXAMPLE 12

The operation was carried out in the same manner as in Example 1 except that instead of tris(trichloromethyl)-s-triazine in Example 1, diphenyl iodonium hexafluorophosphate (above-mentioned T-5) was used. The results are shown in Table 2.

EXAMPLE 13

The operation was carried out in the same manner as in Example 1 except that instead of CY-10 as an infrared absorbing dye in Example 1, a cyanine dye of the above-mentioned S-11 was used, and the wavelength of the semiconductor laser light source was changed to 785 nm. The results are shown in Table 2.

EXAMPLE 14

The operation was carried out in the same manner as in Example 1 except that instead of CY-10 as an infrared absorbing dye in Example 1, a polymethine compound of the above-mentioned S-2 was used. The results are shown in Table 2.

EXAMPLE 15

The operation was carried out in the same manner as in Example 4 except that instead of CY-10 as an infrared absorbing dye in Example 4, a polymethine compound of the above-mentioned S-2 was used. The results are shown in Table 2. Further, a separate sample identical with this, was left to stand in an oven of 55° C. for three days. Then, the sensitivity was determined, whereby the sample maintained the excellent sensitivity.

TABLE 2

| Example | Sensitivity (mJ/cm$^2$) |
| --- | --- |
| 1 | 120 |
| 2 | 100 |
| 3 | 180 |
| 4 | 150 |
| 5 | 180 |
| 6 | 120 |
| 7 | 200 |
| 8 | 180 |
| 9 | 250 |
| 10 | 100 |
| 11 | 160 |

TABLE 2-continued

| Example | Sensitivity (mJ/cm$^2$) |
| --- | --- |
| 12 | 300 |
| 13 | 120 |
| 14 | 180 |
| 15 | 200 |

EXAMPLES 16 TO 25, REFERENCE EXAMPLES 1 TO 3 AND COMPARATIVE EXAMPLE 1

A photosensitive liquid comprising the following components was coated by a wire bar on an aluminum plate prepared by the above described method and dried at 85° C. for 2 minutes to obtain a photosensitive lithographic printing plate having a film thickness of 20 mg/dm$^2$.

| | |
| --- | --- |
| Resin: m-cresol/p-cresol/phenol novolak resin (SK/188, manufactured by Sumitomo Jures K.K.) | 0.5 g |
| Curing agent: Simel 300 (methoxymethylmelamine type, methoxy proportion: at least 90%, manufactured by Mitsui Cyanamid K.K.) | 0.1 g |
| Infrared absorbing dye: compound as identified in Table 3 | 0.015 g |
| Photosensitive acid-forming agent: 2,4,6-tris(trichloromethyl)-s-triazine | 0.015 g |
| Coating solvent: cyclohexanone | 5.7 g |

This printing plate was mounted on a rotary drum, and scanning exposure was carried out by a laser beam (40 mW) formed by focusing a semiconductor laser (830 nm, by Applied Techno K.K.) by a lens to a beam diameter of 25 μm, under a yellow lamp. Then, heating was carried out at 100° C. for 3 minutes, and then development was carried out at 25° C. for 30 seconds with a solution having developer SDR-1 (for a positive printing plate, manufactured by Konica K.K.) diluted 6 times. From the number of revolutions of the drum which gave an image line with a width of 25 μm, the sensitivity was obtained in terms of the energy value. On the other hand, a separate photosensitive lithographic printing plate identical to the above, was left to stand in an oven of 55° C. for 4 days, whereby the stability was evaluated by 3 ratings of A, B and C depending upon the degree of the decrease in sensitivity. Namely, A represents a case where the increase in the above energy value was at most 1.5 times, B represents a case where the same increase is from 1.5 to 2.5 times, and C represents a case where the same increase is at least 2.5 times.

The results are shown in Table 3.

TABLE 3

| | Near infrared absorbing dye | Sensitivity (mJ/cm$^2$) | Stability |
| --- | --- | --- | --- |
| Example 16 | C-1 | 100 | A |
| Example 17 | C-2 | 120 | B |
| Example 18 | C-3 | 90 | A |
| Example 19 | C-4 | 100 | B |
| Example 20 | C-5 | 90 | A |
| Example 21 | C-6 | 120 | A |
| Example 22 | C-7 | 90 | A |
| Example 23 | C-8 | 100 | B |
| Example 24 | C-9 | 80 | A |
| Example 25 | C-10 | 70 | B |

TABLE 3-continued

| | Near infrared absorbing dye | Sensitivity (mJ/cm$^2$) | Stability |
|---|---|---|---|
| Reference Example 1 | S-12 | 160 | C |
| Reference Example 2 | S-5 | 160 | C |
| Reference Example 3 | S-11 | 320 | C |
| Comparative Example 1 | R-1 | 4400 | B |

In the Examples and Reference Examples in Table 3, the symbols in the column for "near infrared absorbing dye" represent the compounds as identified in Table 1, respectively. In the Comparative Example in Table 3, the symbol R-1 in the column for "near infrared absorbing dye" represents the following compound.

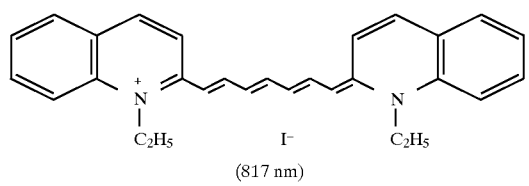

(817 nm)

The wavelength in brackets indicates the maximum absorption wavelength of the same dye.

EXAMPLES 26 TO 29 AND COMPARATIVE EXAMPLES 2 TO 5

A photosensitive liquid comprising the following components was coated by a wire bar on the same aluminum plate as used in Example 1 and dried at 85° C. for 2 minutes to obtain a photosensitive lithographic printing plate having a film thickness of 15 mg/dm$^2$.

| | |
|---|---|
| Resin compound: m-cresol/p-cresol/phenol novolak resin (SK/188, manufactured by Sumitomo Jures K.K.) | 0.5 g |
| Curing agent: Cymel 300 (methoxymethylmelamine type, manufactured by Mitsui Cyanamid K.K.) | 0.2 g |
| Infrared absorbing dye: compound as identified in Table 3 | 0.005 g |
| Photosensitive acid-forming agent: 2,4,6-tris(trichloromethyl)-s-triazine | 0.004 g |
| Coating solvent: solvent mixture comprising 6 g of cyclohexanone and 1 g of ethanol | |

The printing plate was subjected to scanning exposure by a semiconductor laser (830 nm) in the same manner as described above. Then, heating (PEB) was carried out at 100° C. for 3 minutes, and further, development was carried out by using the same developer as described above. The sensitivity was determined in the same manner as described above, and the results are shown in Table 4. In the Examples in Table 4, the symbols in the column for "near infrared absorbing dye" represent the compounds as identified in Table 1, respectively. In the Comparative Examples in Table 4, the symbols R-2 to R-4 in the column for "near infrared absorbing dye" represent the following compounds.

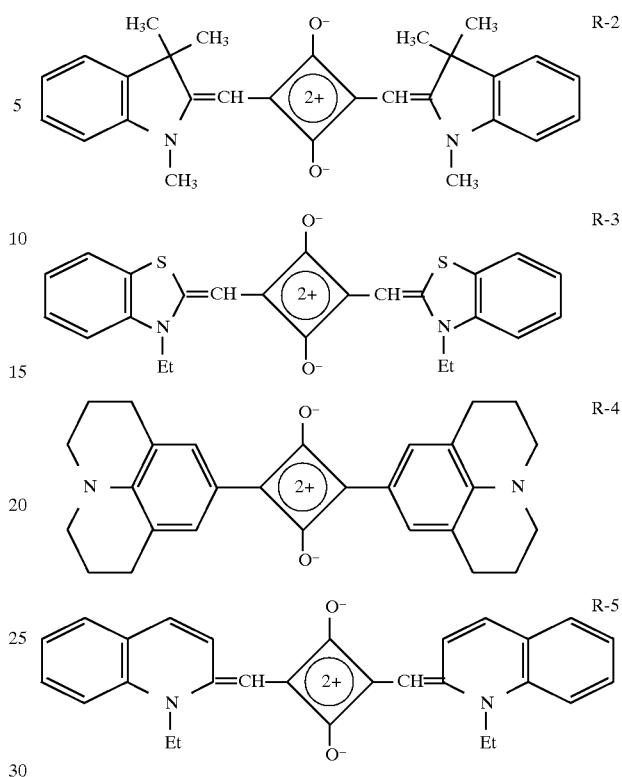

TABLE 4

| | Near infrared absorbing dye | Sensitivity (mJ/cm$^2$) |
|---|---|---|
| Example 26 | C-5 | 80 |
| Example 27 | C-2 | 120 |
| Example 28 | C-9 | 100 |
| Example 29 | C-3 | 80 |
| Comparative Example 2 | R-2 | >4400 |
| Comparative Example 3 | R-3 | 3300 |
| Comparative Example 4 | R-4 | >4400 |
| Comparative Example 5 | R-5 | >4400 |

EXAMPLES 30 AND 31 AND COMPARATIVE EXAMPLES 6 AND 7

With respect to some of the samples evaluated as described above, the sensitivity to light rays of 750 nm was determined by a different measuring method under the following conditions. Namely, using a xenon lamp (UI 501C, manufactured by Ushio Electric Co., Ltd.) as the light source, each sample was irradiated for 5 minutes by means of a spectroscopic irradiation apparatus (RM-23, manufactured by Narumi K.K.) with the abscissa being the wavelength and the ordinate being the light intensity which underwent logarithmic attenuation. The exposed sample was heated (PEB) in the same manner as described above, followed by development, whereupon from the height of the cured image obtained against the light rays of 750 nm, the energy value required for photocuring was determined and taken as the sensitivity at the same wavelength. The results are shown in Table 5.

TABLE 5

| Sample | | Sensitivity (mJ/cm$^2$) |
|---|---|---|
| Example 30 | Same as in Example 11 | 330 |
| Example 31 | Same as in Example 13 | 160 |
| Comparative Example 6 | Same as in Comparative Example 2 | >1050 |
| Comparative Example 7 | Same as in Comparative Example 3 | 1050 |

EXAMPLE 32 AND COMPARATIVE EXAMPLES 8 AND 9

A photosensitive liquid comprising the components as identified in Table 6, was coated by a wire bar on the same aluminum plate as used in Example 1 and dried at 85° C. for 2 minutes to obtain a photosensitive lithographic printing plate having a film thickness of 15 mg/dm$^2$. The resol resin (PS-4512 and PS-2105) in the Table was the one manufactured by Gune Kagaku K.K.

TABLE 6

| Composition of Example 32 | | Composition of Comparative Example 8 | | Composition of Comparative Example 9 | |
|---|---|---|---|---|---|
| Novolak resin as used in Example 1 | 0.5 g | Novolak resin as used in Example 1 | 0.3 g | Novolak resin as used in Example 1 | 0.3 g |
| Curing agent as used in Example 1 | 0.1 g | Resol resin PS-4512 | 0.3 g | Resol resin PS-2105 | 0.3 g |
| Photosensitive acid-forming agent as used in Example 1 | 0.03 g | Photosensitive acid-forming agent as used in Example 1 | 0.03 g | Photosensitive acid-forming agent as used in Example 1 | 0.03 g |
| Cyanine dye C-17 | 0.05 g | Cyanine dye C-17 | 0.05 g | Cyanine dye C-17 | 0.05 g |
| Cyclohexanone | 7 g | Cyclohexanone | 7 g | Cyclohexanone | 7 g |

In Table 6, cyanine dye C-17 is the compound identified in Table 1.

With respect to each of the obtained printing plates, scanning exposure was carried out by a semiconductor laser in the same manner as in Example 1, and then post heating (PEB) treatment was applied at 110° C. Then, development was carried out with the same developer as mentioned above. Here, to determine the optimum conditions for each of the printing plate samples, the treating time for the above PEB was varied, and the diluting degree of the developer SDR-1 was varied, for evaluation. As a result, in Example 32, a PEB time of 30 seconds was sufficient, and the sensitivity was 60 mJ/cm$^2$ under both conditions of the dilution of 6 times and 8 times.

In Comparative Example 8, the sensitivity was >880 mJ/cm$^2$ with a PEB time of 30 seconds, 440 mJ/cm$^2$ with a PEB time of 2 minutes, and 220 mJ/cm$^2$ with a PEB time of 5 minutes. These results were obtained under both conditions of dilution of 6 times and 8 times.

In Comparative Example 9, the sensitivity was >880 mJ/cm$^2$ with a PEB time of 5 minutes or less under both conditions of dilution. With a PEB time of 5 minutes and dilution of 6 times, the sensitivity scarcely reached 880 mJ/cm$^2$.

EXAMPLE 33

Evaluation was carried out in the same manner as in Example 32 except that instead of the cyanine dye C-17, C-10 was used, whereby a PEB time of 30 seconds was sufficient, and the sensitivity was 80 mJ/cm$^2$ under both conditions of dilution of 6 times and 8 times.

COMPARATIVE EXAMPLE 10

Evaluation was carried out in the same manner as in Comparative Example 8 except that instead of the cyanine dye C-17, C-10 was used, whereby the sensitivity was >880 mJ/cm$^2$ with a PEB time of 30 seconds, 560 mJ/cm$^2$ with a PEB time of 2 minutes and 280 mJ/cm$^2$ with a PEB time of 5 minutes. These results were obtained under both conditions of dilution of 6 times and 8 times.

EXAMPLE 34

Scanning exposure was applied in an image pattern to the same photosensitive lithographic printing plate as used in Example 16 by means of a semiconductor laser with an exposure of 200 mJ/cm$^2$, followed by PEB and development treatment in the same manner. Further, a gum liquid SGW-3 (Konica Co., Ltd.) was diluted twice and then coated on the surface of the printing plate. The obtained printing plate was mounted on a printing machine Dia 1F (manufactured by Mitsubishi Heavy Industries Co., Ltd.), and printing was carried out, whereby it showed printing resistance of at least 50,000 sheets. Further, a separate printing plate subjected to the same development treatment as above, was subjected to baking treatment at 200° C. for 5 minutes, and the printing plate thereby obtained showed printing resistance of at least 150,000 sheets.

EXAMPLES 35 TO 38 AND REFERENCE EXAMPLE 4

A photosensitive liquid comprising the following components, was coated by-a wire bar on an aluminum plate prepared in the above described method and dried at 85° C. for 2 minutes to obtain a photosensitive lithographic printing plate having a film thickness of 20 mg/dm$^2$.

| | |
|---|---|
| Resin compound: m-cresol/p-cresol/phenol novolak resin (SK/188, manufactured by Sumitomo Jures K.K.) | 0.5 g |
| Curing agent: Cymel 300 (methoxymethylmelamine type, manufactured by Mitsui Cyanamid K.K.) | 0.1 g |
| Infrared absorbing dye: S-1 (CY-10, manufactured by Nihon Kayaku K.K.) | 0.025 g |
| Photosensitive acid-forming agent: 2,4,6-tris(trichloromethyl)-s-triazine | 0.004 g |
| Coating solvent: cyclohexanone | 5.7 g |
| Component (e): compound as identified in Table 7 | 0.024 g |

This printing plate was mounted on a rotary drum, and scanning exposure was carried out with a laser beam (40 mW) formed by focusing a semiconductor laser (830 nm, by Applied Techno K.K.) by a lens to a beam diameter of 25 µm, under a yellow lamp. Then, post heating was carried out at 100° C. for 3 minutes, and further, development was carried out at 25° C. for 30 seconds with a solution prepared by diluting a developer SDR-1 (for a positive printing plate, manufactured by Konica Co., Ltd.) 6 times. From the number of revolutions of the drum which gave an image line with a width of 25 µm, the sensitivity was obtained in terms of the energy value, which was taken as the initial sensitivity. On the other hand, the same test specimen as the above photosensitive lithographic printing plate was left to stand in an oven at a temperature of 55° C. for 6 days for accelerated deterioration, and then the energy value was obtained in the same manner as above, which was taken as the oven-treated sensitivity. Then, the sensitivity retention was calculated in accordance with the following formula:

Sensitivity retention = 1/oven treated sensitivity ÷ 1/initial sensitivity

The results are shown in Table 7.

TABLE 7

|  | Component (e) | Initial sensitivity | Sensitivity retention |
|---|---|---|---|
| Example 35 | 2MBT | 75 mJ/cm² | 0.40 |
| Example 36 | 2MBI | 90 | 0.50 |
| Example 37 | 2MBO | 90 | 0.64 |
| Example 38 | EAP | 85 | 0.44 |
| Reference Example 4 | — | 90 | 0.28 |

The symbols in the column for "component (e)" in table 7 represent the following compounds, respectively.
2MBT: 2-mercaptobenzothiazole
2MBI: 2-mercaptobenzimidazole
2MBO: 2-mercaptobenzoxazole
EAP: Ethyl benzoate

EXAMPLE 39

Evaluation was carried out in the same manner as in Example 37 except that instead of Cymel 300, a melamine curing agent having a methoxy proportion of at least 95%, was used. The initial sensitivity was 70 mJ/cm², and the sensitivity retention was 0.60.

REFERENCE EXAMPLE 5

A sample was prepared and evaluated in the same manner as in Example 39 except that 2-mercaptobenzoxazol (2MBO) was not added.

The initial sensitivity was 80 mJ/cm², and the sensitivity retention was 0.32.

EXAMPLE 40

Evaluation was carried out in the same manner as in Example 38 except that the novolak resin was changed to phenol novolak SK-3 (manufactured by Sumitomo Jures K.K.). The initial sensitivity was 100 mJ/cm², and the sensitivity retention was 0.40.

EXAMPLE 41

Evaluation was carried out in the same manner as in Example 36 except that S-11 was used as the infrared absorbing dye, whereby the initial sensitivity was 130 mJ/cm², and the sensitivity retention was 0.46.

EXAMPLE 42

Evaluation was carried out in the same manner as in Example 37 except that T-5 was used as the photosensitivity acid-forming agent. The initial sensitivity was 200 mJ/cm², and the sensitivity retention was 0.40.

The present invention provides a photosensitive composition having good stability and excellent sensitivity characteristics to a near infrared laser beam and a lithographic printing plate employing such a photosensitive composition.

What is claimed is:

1. A photosensitive composition comprising (a) a resin selected from the group consisting of novolak resins and polyvinylphenol resins;

(b) an amino compound derivative capable of curing the resin;

(c) at least one member selected from the group consisting of cyanine compounds of the following formula (I) and polymethine compounds of the following formula (II), as a compound showing absorption in a near infrared wavelength region:

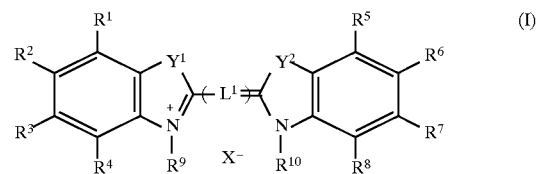

wherein each of $R^1$ to $R^8$ which are independent of one another, is a hydrogen atom, a halogen atom or a nitro group, or the adjacent groups among $R^1$ to $R^8$ may be connected to each other to form a condensed benzene ring, each of $R^9$ and $R^{10}$ which are independent of each other, is an alkyl group which may have a substituent, a phenyl group which may have a substituent, an alkenyl group which may have a substituent, or an alkynyl group which may have a substituent, each of $Y^1$ and $Y^2$ which are independent of each other, is a sulfur atom or a dialkylmethylene group, $L^1$ is a penta- or hepta-methine group which may have a substituent, wherein two substituents on the penta- or hepta-methine group may be connected to each other to form a $C_{5-7}$ cycloalkene ring, and $X^-$ is a counter anion;

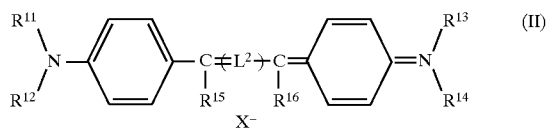

wherein each of $R^{11}$ to $R^{14}$ which are independent of one another, is an alkyl group, each of $R^{15}$ and $R^{16}$ which are independent of each other, is an aryl group which may have a substituent, $L^2$ is a mono-, tri- or penta-methine group which may have a substituent, and $X^-$ is a counter anion; and (d) a photosensitive acid-forming agent.

2. The photosensitive composition according to claim 1, wherein the compound (c) showing absorption in a near infrared wavelength region, is at least one member selected from the group consisting of cyanine compounds of the formula (I).

3. The photosensitive composition according to claim 2, wherein in the formula (I), each of $R^9$ and $R^{10}$ which are independent of each other, is an alkyl group which may be substituted by an alkoxy group, a phenoxy group, an alkoxycarbonyl group, a phenyl group, a hydroxyl group, a sulfonic acid group, a halogen atom or a carboxyl group; a phenyl group which may be substituted by an alkoxy group, a phenoxy group, an alkoxycarbonyl group, a phenyl group, a hydroxyl group, a sulfonic acid group, a halogen atom or a carboxyl group; an alkenyl group which may be substituted by an alkoxy group or a phenoxy group; or an alkenyl group which may be substituted by an alkoxy group or a phenoxy group.

4. The photosensitive composition according to claim 2, wherein in the formula (I), $L^1$ is a group of the formula

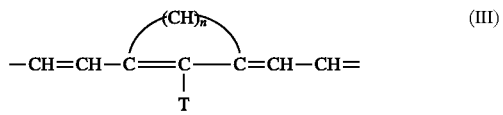

wherein n is an integer of from 2 to 4, and T is a halogen atom.

5. The photosensitive composition according to claim 2, wherein in the formula (I), each of $Y^1$ and $Y^2$ which are independent of each other, is a sulfur atom or a dimethylmethylene group.

6. The photosensitive composition according to claim 2, wherein in the formula (I), each of $R^9$ and $R^{10}$ which are independent of each other, is an alkyl group which may be substituted by an alkoxy group, a phenoxy group, an alkoxycarbonyl group, a phenyl group, a hydroxyl group, a sulfonic acid group, a halogen atom or a carboxyl group; a phenyl group which may be substituted by an alkoxy group, a phenoxy group, an alkoxycarbonyl group, a phenyl group, a hydroxyl group, a sulfonic acid group, a halogen atom or a carboxyl group; an alkenyl group which may be substituted by an alkoxy group or a phenoxy group; or an alkynyl group which may be substituted by an alkoxy group or a phenoxy group; $L^1$ is a group of the formula (III), and each of $Y^1$ and $Y^2$ which are independent of each other, is a sulfur atom or a dimethylmethylene group.

7. The photosensitive composition according to claim 6, wherein in the formula (I), each of $R^9$ and $R^{10}$ which are independent of each other, is an alkyl group, an allyl group, a phenyl group, a hydroxyalkyl group, a phenoxyalkyl group, or an alkoxyalkyl group.

8. The photosensitive composition according to claim 1, wherein the compound (c) showing absorption in a near infrared wavelength region is at least one member selected from the group consisting of polymethine compounds of the formula (II).

9. The photosensitive composition according to claim 8, wherein in the formula (II), each of $R^{15}$ and $R^{16}$ which are independent of each other, is a group of the following formula (IV), and $L^2$ is a trimethine group which may have a substituent:

wherein W is a hydrogen atom or a dialkylamino group.

10. The photosensitive composition according to claim 1, wherein the resin (a) is a novolak resin.

11. The photosensitive composition according to claim 1, wherein the amino compound derivative (b) is a melamine derivative.

12. The photosensitive composition according to claim 1, wherein the amino compound derivative (b) is a melamine derivative having alkoxymethyl groups and methylol groups, wherein the proportion of the number of the alkoxymethyl groups in the total number of both substituents, is at least 90%.

13. The photosensitive composition according to claim 1, wherein the photosensitive acid-forming agent (d) is a s-triazine compound having at least two trihalomethyl groups.

14. The photosensitive composition according to claim 1, wherein the resin (a) is a novolak resin, the amino compound derivative (b) is a melamine derivative having alkoxymethyl groups and methylol groups, wherein the proportion of the number of the alkoxymethyl groups in the total number of both substituents, is at least 90%, and the photosensitive acid-forming agent (d) is a s-triazine compound having at least two trihalomethyl groups.

15. The photosensitive composition according to claim 1, which further contains (e) a heterocyclic thiol and/or an alkyl dialkylaminobenzoate.

16. The photosensitive composition according to claim 15, wherein the heterocyclic thiol is a compound of the following formula (V):

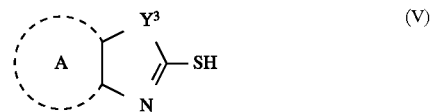

wherein A is a benzene ring or a naphthalene ring, and $Y^3$ is —O—, —S— or —NR$^{17}$—, wherein $R^{17}$ is a hydrogen atom, a $C_{1-20}$ alkyl group or a $C_{1-20}$ acyl group.

17. The photosensitive composition according to claim 15, wherein the heterocyclic thiol is 2-mercaptobenzoxazole, 2-mercaptobenzimidazole or 2-mercaptobenzothiazole.

18. The photosensitive composition according to claim 15, wherein the alkyl dialkylaminobenzoate is a compound of the following formula (VI):

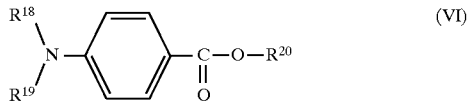

wherein each of $R^{18}$ and $R^{19}$ which are independent of each other, is a $C_{1-4}$ alkyl group, and $R^{20}$ is a $C_{1-10}$ alkyl group.

19. The photosensitive composition according to claim 15, wherein the alkyl dialkylaminobenzoate is ethyl p-dimethylaminobenzoate.

20. The photosensitive composition according to claim 15, wherein the resin (a) is a novolak resin, the amino compound derivative (b) is a melamine derivative having alkoxymethyl groups and methylol groups, wherein the proportion of the number of the alkoxymethyl groups in the total number of both substituents is at least 90%, the compound (c) showing absorption in a near infrared wavelength region is a cyanine compound of the formula (I), wherein each of $R^9$ and $R^{10}$ which are independent of each other, is an alkyl group which may be substituted by an alkoxy group, a phenoxy group, an alkoxycarbonyl group, a phenyl group, a hydroxyl group, a sulfonic acid group or a carboxyl group; a phenyl group which may be substituted by an alkoxy group, a phenoxy group, an alkoxycarbonyl group, a phenyl group, a hydroxyl group, a sulfonic acid group or a carboxyl group; an alkenyl group which may be substituted by an alkoxy group or a phenoxy group; or an alkynyl group which may be substituted by an alkoxy group or a phenoxy group, $L^1$ is a group of the formula (III), each of $Y^1$ and $Y^2$ which are independent of each other, is a sulfur atom or a dimethylmethylene group, the photosensitive acid-forming agent (d) is a s-triazine compound having two trihalomethyl groups, and the heterocyclic thiol (e) is 2-mercaptobenzoxazole, 2-mercaptobenzimidazole or 2-mercaptobenzothiazole.

21. The photosensitive composition according to claim 15, wherein the resin (a) is a novolak resin, the amino compound derivative (b) is a melamine derivative having alkoxymethyl groups and methylol groups, wherein the proportion of the number of the alkoxymethyl groups in the total number of both substituents, is at least 90%, the compound (c) showing absorption in a near infrared wavelength region, is a cyanine compound of the formula (I) wherein each of $R^9$ and $R^{10}$ is an alkyl group which may be substituted by an alkoxy group, a phenoxy group, an alkoxycarbonyl group, a phenyl group, a hydroxyl group, a sulfonic acid group or a carboxyl group; a phenyl group which may be substituted by an alkoxy group, a phenoxy group, an alkoxycarbonyl group, a phenyl group, a hydroxyl group, a sulfonic acid group or a carboxyl group; an alkenyl group which may be substituted by an alkoxy group or a phenoxy group; or an alkynyl group which may be substituted by an alkoxy group or a phenoxy group, $L^1$ is a group of the formula (III), each of $Y^1$ and $Y^2$ which are independent of each other, is a sulfur atom or a dimethylmethylene group, the photosensitive acid-forming agent (d) is a s-triazine compound having at least two trihalomethyl groups, and the alkyl dialkylaminobenzoate (e) is ethyl p-dimethylaminobenzoate.

22. A lithographic printing plate having a photosensitive composition according to claim 1 formed on a support.

\* \* \* \* \*